United States Patent
Suga et al.

[11] Patent Number: 6,052,284
[45] Date of Patent: Apr. 18, 2000

[54] PRINTED CIRCUIT BOARD WITH ELECTRONIC DEVICES MOUNTED THEREON

[75] Inventors: Kazunari Suga, Gyoda; Akihiro Fujimoto, Gunma, both of Japan

[73] Assignee: Advantest Corporation, Tokyo, Japan

[21] Appl. No.: 08/902,154

[22] Filed: Jul. 29, 1997

[30]   Foreign Application Priority Data

Aug. 6, 1996  [JP]  Japan .................................. 8-207343
Apr. 25, 1997 [JP]  Japan .................................. 9-109155

[51] Int. Cl.[7] ............................................... H05K 7/20
[52] U.S. Cl. ...................... 361/699; 361/689; 361/698; 361/704; 361/719; 361/720; 174/15.1; 165/80.4
[58] Field of Search ................................. 361/689–694, 361/693, 699–704, 715, 719, 727, 756; 257/687, 714, 721, 722; 174/15.1, 16.1; 165/80.3, 80.4

[56]                References Cited

U.S. PATENT DOCUMENTS

| | | | |
|---|---|---|---|
| 4,531,176 | 7/1985  | Beecher et al.  | 361/816 |
| 5,021,924 | 6/1991  | Kieda et al. . | |
| 5,270,572 | 12/1993 | Nakajima et al. | 361/699 |
| 5,323,292 | 6/1994  | Brzezinski | 361/689 |
| 5,448,108 | 9/1995  | Quon et al. | 361/699 |
| 5,574,627 | 11/1996 | Porter | 361/719 |
| 5,774,334 | 6/1998  | Kawamura et al. | 361/699 |
| 5,841,634 | 11/1998 | Visser | 361/699 |

FOREIGN PATENT DOCUMENTS

| | | |
|---|---|---|
| 0243239 A2 | 10/1987 | European Pat. Off. . |
| 0341950 A2 | 11/1989 | European Pat. Off. . |
| 2359148    | 8/1974  | Germany ........................ 361/699 |
| 2-188995   | 7/1990  | Japan ............................. 361/699 |
| 3-50897    | 3/1991  | Japan ............................. 361/699 |
| 2183304    | 6/1987  | United Kingdom . |

OTHER PUBLICATIONS

"Heat Transfer in a Liquid Cooling System" Cohen et al. IBM Technical Disclosure Bulletin, vol. 11, No. 6, Nov. 1968.

"High –Power Electronic Package" D. J. Crawford IBM Technical Disclosure Bulletin, vol. 20, No. 11A, Apr. 1978.

"Cold Plate for Thermal Conduction Module with Reduced Water Flow Resistance< Increased Fin Area< and Improved Water Turbulence" IBM Technical Disclosure Bulletin, vol. 29, No. 2, Jul. 1986.

Primary Examiner—Leo P. Picard
Assistant Examiner—Boris L. Chervinsky
Attorney, Agent, or Firm—Staas & Halsey LLP

[57]                ABSTRACT

A cooler-equipped printed circuit board, in which electronic devices arranged in a matrix form on the printed circuit board are covered with a sealed case held in liquidtight contact with the board and having a coolant channel from an inlet port and an outlet port made in the case. Barriers are provided in the coolant channel to change the direction of flow of the coolant to stir it and make its temperature uniform throughout it.

31 Claims, 12 Drawing Sheets

PRINTED CIRCUIT BOARD WITH ELECTRONIC DEVICES MOUNTED THEREON

BACKGROUND OF THE INVENTION

1. Field of the Invention

The present invention relates to a printed circuit board with electronic devices mounted thereon and, more particularly, to a printed circuit board equipped with a cooler having a sealed case wherein a liquid coolant is passed over the printed circuit board having mounted thereon LSIs or similar semiconductor devices of large calorific power.

2. Background of the Related Art

Because of the recent increase in the LSI integration density as well as the recent speeding up of LSI operations, calorific power that individual high-density LSIs generate keeps on increasing. Such being the case, there is a demand for the development of a more efficient cooling unit for a high-density-LSI-mounted, printed circuit board. The LSI-mounted printed circuit board has a required number of LSIs mounted on one or both sides of the board. To cool the LSIS, it is customary in the prior art to cool the entire structure of the LSI-mounted printed circuit board by forced air cooling or liquid cooling of the type that soaks the printed circuit board in a liquid coolant.

The forced air cooling does not sufficiently achieve the intended purpose of cooling LSIs of large calorific power. The liquid cooling involves the immersion of the whole printed circuit board structure in the coolant, and hence it has a defect that the cooler therefor is inevitably bulky. In addition, since the liquid cooling of the printed circuit board substantially relies on convection of the coolant, it is impossible to produce a satisfactory effect of cooling the printed circuit board when electronic devices of large calorific power are mounted thereon.

SUMMARY OF THE INVENTION

It is therefore an object of the present invention to provide an electronic-devices-mounted, printed circuit board equipped with a highly efficient but small cooler.

According to an aspect of the present invention, the electronic-devices-mounted, printed circuit board comprises: a printed circuit board having an electronic device array mounted on at least one side thereof; and a sealed case that houses the electronic device array, has its marginal edges held in liquidtight contact with one side of the printed circuit board all around the electronic device array and has an inlet port for supplying therethrough a coolant into the sealed case from the outside and an outlet port for discharging therethrough the coolant to the outside. The interior of the sealed case forms a cooling chamber in which the electronic devices are soaked in the coolant that is supplied through the inlet port, distributed through the electronic devices and drained through the outlet port to the outside.

According to another aspect, the cooling chamber has a plurality of barriers which extend between adjacent electronic devices across their array so that the coolant channel or passage from the inlet to the outlet port meander through the individual electronic devices.

According to still another aspect, the electronic devices are arranged in a matrix form on the printed circuit board and the sealed case has a box-like configuration which has a bottom panel, a pair of opposed side walls extending in the column direction of the matrix and a pair of opposed end walls joining opposed ends of the above-mentioned two side walls, and a partition wall extending from one of the end walls to a position a little short of the other to define therebetween a clearance and dividing the matrix array of electronic devices in its column direction into two submatrix arrays, thereby providing a substantially U-shaped coolant channel from the inlet to the outlet port.

BRIEF DESCRIPTION OF THE DRAWINGS

FIG. 8B is a sectional view taken on the line 8b–8b' in FIG. 8A;

DESCRIPTION OF THE PREFERRED EMBODIMENT

Figures 1A, 1B:
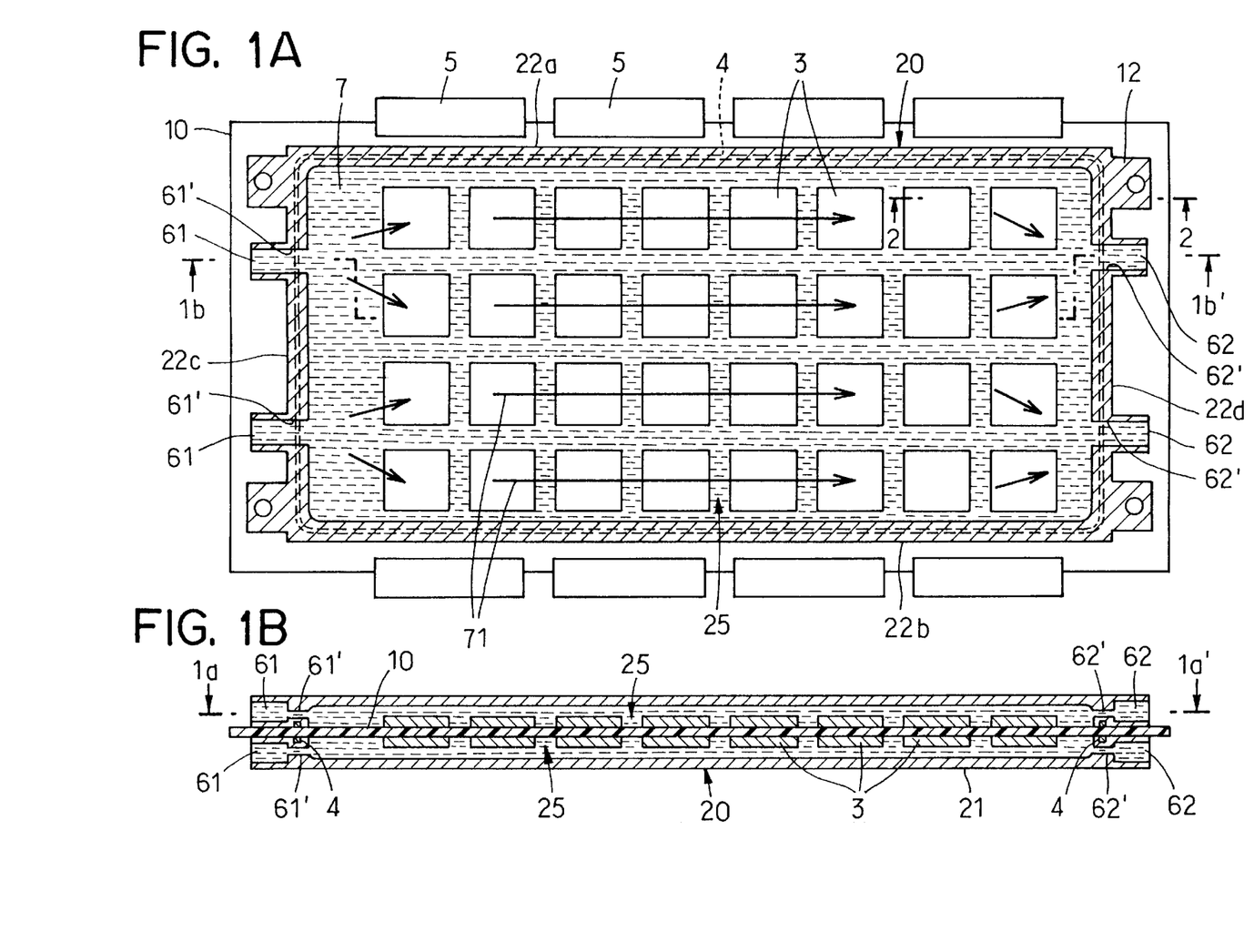
FIG. 1A is a plan sectional view of an embodiment of the present invention.
FIG. 1B is a sectional view taken on the line 1b–1b' in FIG. 1A.

A description will be given, with reference to FIGS. 1A and 1B, of a first embodiment of the cooler-equipped printed circuit board according to the present invention. FIG. 1A is a sectional view taken on the line 1a–1a' in FIG. 1B and FIG. 1B a sectional view taken on the line 1b–1b' in FIG.

Figure 2:
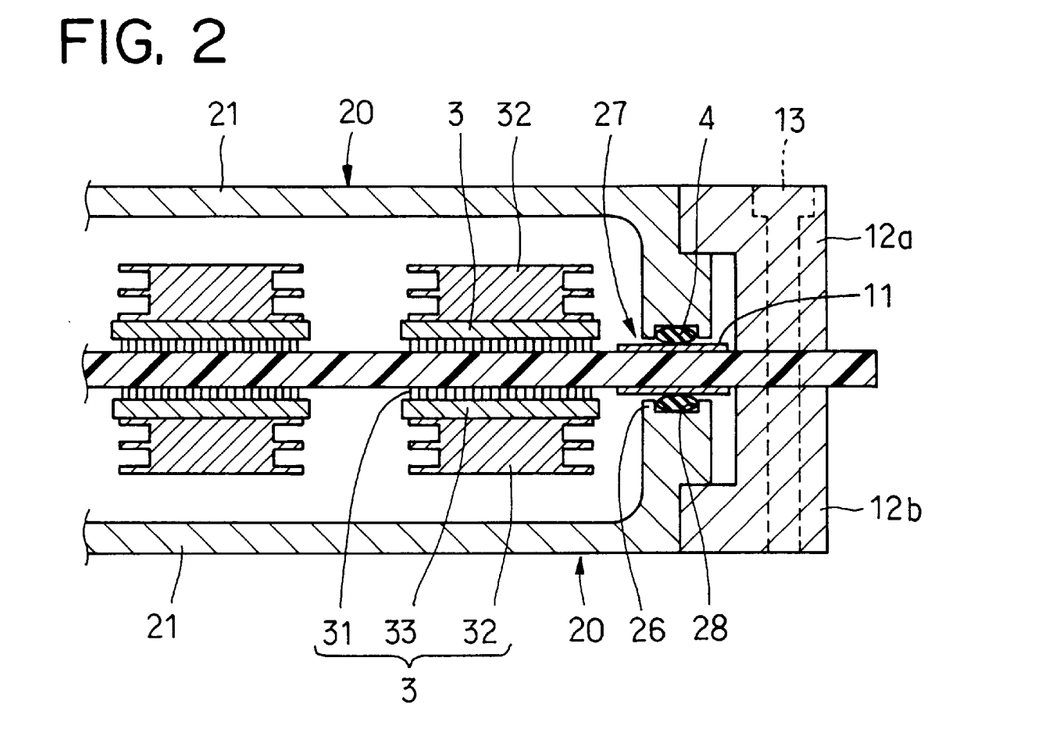
FIG. 2 is a partially enlarged sectional view of the embodiment shown in FIGS. 1A and 1B.

1A. As shown in FIGS. 1A and 1B, there is mounted on a printed circuit board 10 over the entire area of its either side a matrix array of 32 electronic devices 3 of large calorific power, such as LSIs. Each side of the printed circuit board 10 is covered with a box-like sealed case 20 which has its one side opened and forms a cooling chamber wherein the electronic devices 3 are housed and a coolant 7 is distributed through the electronic devices 3. The sealed case 20 comprises a bottom panel 21, a pair of opposed side panels 22a, 22b and a pair of end panels 22c, 22d. As depicted in FIG. 2, each electronic device 3 comprises an LSI 33 having terminal pins 31 and a radiator 32 having radiation fins and held in intimate contact with the LSI 33. Both sides of the printed circuit board 10 and marginal portions 26 of the sealed case 20 are pressed in liquidtight contact with each other by clamps 12a and 12b through elastic O rings 4 and fixed by screws 13.

The terminal pins 31 of the electronic device 3 connect therethrough the LSI 33 to the printed circuit board 10 electrically and mechanically. The radiator 32, which is fixedly contacted with the surface of the LSI 33 is made of a good thermal conductor such as copper or aluminum and has a plurality of radiation fins formed on the surface thereof. The printed circuit board 10 further has a number of connectors 5 mounted thereon at its marginal edges. The terminal pins 31 of the electronic devices 3 are connected to the connectors 5 through multi-layer interconnections of the printed circuit board 10. Between the sealed case 20 and the printed circuit board 10 there is defined the cooling chamber 25 wherein the electronic devices 3 are housed and cooled by the coolant 7 distributed therethrough in the direction indicated by the arrows 71. Reference numeral 61 denotes an inlet port for injecting the coolant 7 into the cooling chamber and 61' an inlet port made in the end wall 22c. Reference numeral 62 denotes an outlet port for discharging therethrough the coolant 7 from the cooling chamber 25 and 62' an outlet port made in the end wall 22d.

The coolant 7 flows through the inlet ports 61 and 61' into the cooling chamber 25, wherein the electronic devices 3 are immersed in the coolant 7. The coolant 7 flows in the direction of the arrows 71 while cooling the electronic device 3 and is drained through the outlet ports 62 and 62' to the outside of the sealed case 20.

As shown in FIG. 2, a sealing means 27 is used to provide liquidtight joints between the printed circuit board 10 and the marginal end portion 26 of the sealed case 20. Reference numeral 11 denotes metallic foil predeposited on the surface area of the printed circuit board 10 for liquidtight contact with the marginal end portion 16 of the sealed case 20. The printed circuit board 10 and the sealed case 20 are joined together with the elastic 0 ring packing 4 interposed between a groove 28 cut in the end face of the marginal end portion 26 and the metallic foil 11 and the sealed case 20 is pressed against and fixed to the printed circuit board 10 by means of clamps 12a and 12b. The metallic foil 11 is formed by depositing a gold-plated pattern on the surface of the printed circuit board 10 or depositing a copper pattern first and then plating it with gold. The elastic packing 4 that is held between the sealed case 20 and the printed circuit board 10 is made of a material free from degradation by the coolant 7. Used as the coolant 7 is, for example, FLUORINERT (Trademark: 3M, Inc.) that is an inert liquid. By plating the metallic foil 11 with gold, the sealing property of the sealing means 27 can be retained for a long period of time. The construction of the sealing means 27 described above is also applied to all the embodiments of the invention that will be described later on.

The radiator 32 mounted on each electronic device 3 housed in the cooling chamber 25 is cooled by the coolant 7 that is properly temperature controlled and injected into the sealed case 20 under a required pressure from an external refrigerator through the inlet port 61 and a pipe. The coolant 7 injected into the cooling chamber 25 through the inlet port 61 flows as indicated by the arrows 71 while absorbing heat from the electronic devices 3 and their radiators 32 and is discharged to the outside through the outlet port 62.

By injecting the coolant 7 into the cooling chamber 25 through the inlet ports 61 and 61' and discharging it through the outlet ports 62 and 62' as mentioned above, the heat given off by the electronic devices 3 is absorbed by the coolant 7 flowing in contact with them, and hence it can efficiently be dissipated. Additionally, since the sealed case is mounted on the printed circuit board so that it covers the electronic device array, the assembly can be made small.

In the embodiment of FIGS. 1A and 1B, the coolant 7 flows substantially in parallel with the direction of arrangement of the electronic devices 3 as indicated by the arrows 71. Hence, a high-temperature cross-sectional region of the coolant flux which flows near the electronic devices 3 and a relatively-low-temperature cross-sectional region of the coolant flux which flows off the electronic devices 3 tend to have a steady distribution. As a result, an appreciable amount of the coolant flux in the relatively-low-temperature cross-sectional region is drained intact from the cooling chamber 25, giving rise to a problem that the coolant is not effectively utilized to dissipate the heat generated by the electronic devices 3. In such a state, the cooling efficiency does not increase even if the flow rate of the coolant 7 is set at a large value. When the coolant flux flowing in contact with the electronic devices 3 has a low flow rate, it undergoes a large temperature rise. In such an instance, as the coolant 7 flows downstream, its temperature gradually rises and its cooling ability diminishes accordingly, resulting in a marked increase in the temperature of the electronic devices 3 lying downstream.

The flow rate of the coolant 7 could be increased by raising the coolant injection pressure to increase its velocity of flow. With the use of an arrangement for injecting the coolant at high pressure, the reliability of liquidtightness for the coolant 7 would also decrease. Furthermore, such an arrangement would make the liquid cooling unit bulky and raise its manufacturing cost accordingly.

To heighten the heat absorbing effect of the coolant 7, it is desirable to make the entire coolant flux contribute to the heat absorption as equally as possible. That is, it is important to give every portion of the coolant 7 an opportunity for flowing in touch with the electron devices 3. This can be achieved by disturbing the coolant flux in its cross-sectional region. Next, a description will be given of another embodiment of the present invention intended for enhanced cooling efficiency by changing the direction of flow of the coolant 7 or disturbing its flow by barriers set up in the cooling chamber 25. Incidentally, although in the following embodiments no reference is made, for brevity, to the clamps 12a, 12b and the screws 13 shown in FIGS. 1A and 2, they shall naturally be provided.

Figure 3A:
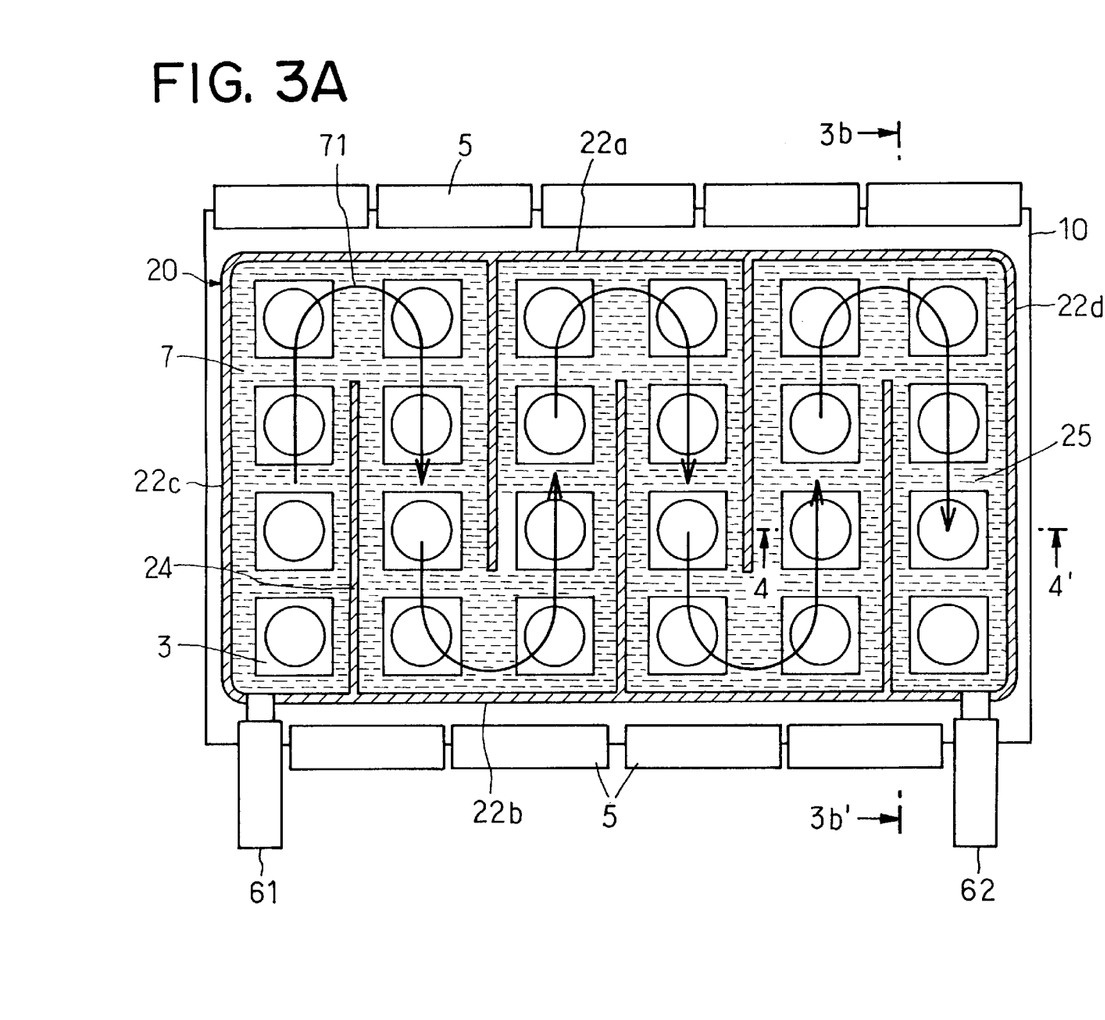
FIG. 3A a plan sectional view of another embodiment of the present invention.
Figure 3B:
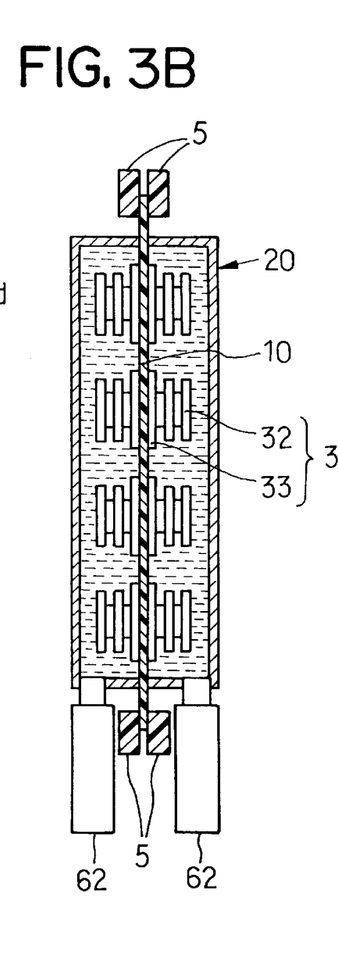
FIG. 3B is a sectional view taken on the line 3b–3b' in FIG. 3A.

The embodiment shown in FIGS. 3A and 3B differs from the embodiment of FIGS. 1A and 1B in that the electronic devices 3 are arranged in the form of a matrix with 6 rows and 4 columns and that barriers 24 are formed which extend alternately from one of the opposed side walls 22a and 22b toward the other and the latter toward the former every other column. In this embodiment, the coolant inlet port 61 and the outlet port 62 are provided near the opposite ends of the same side wall 22b. Since the direction of flow of the coolant 7 from the inlet port 61 to the outlet port 62 is reversed by the barriers 24 a plurality of times as indicated by the arrows, the coolant flux is stirred or disturbed and a uniform temperature distribution is provided over the entire flux.

Figure 4:
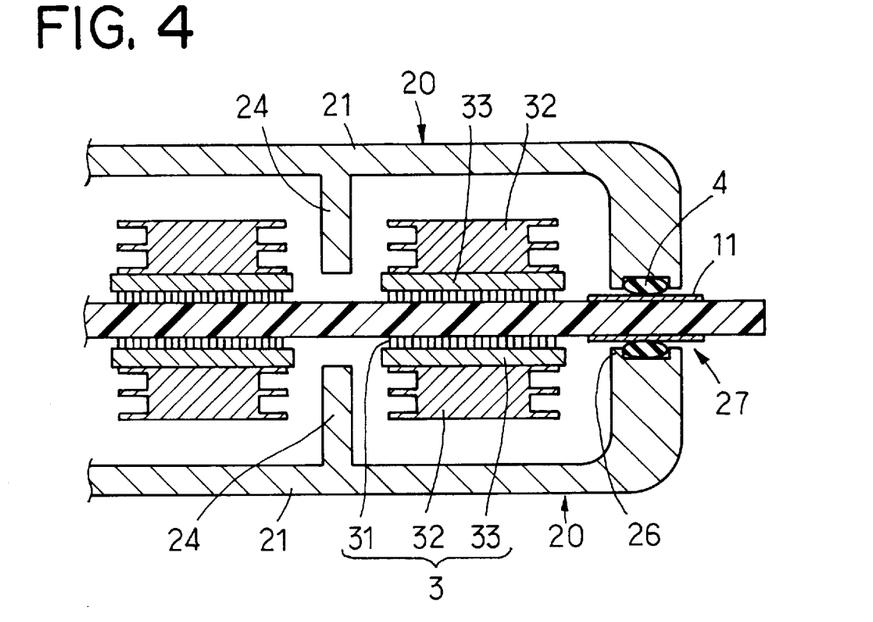
FIG. 4 is a partially enlarged sectional view of the embodiment shown in FIGS. 3A and 3B.

FIG. 3B is a sectional view taken in the direction of the arrows from the line 3b–3b' in FIG. 3A and FIG. 4 a partly enlarged sectional view taken in the direction of the arrows from the line 4–4' in FIG. 3A.

In FIGS. 3A, 3B and 4, the printed circuit board 10 has on its either side the electronic devices 3 arranged in a matrix form as in the case of the FIG. 1 embodiment. The electronic devices 3 are each electrically and mechanically connected by the terminal pins 31 to the printed circuit board 10. Each electronic device 3 has the radiator means 32 fixedly secured to its surface and the radiator means 32 has a plurality radiation fins formed on its surface. On either side of the printed circuit board 10 there are mounted the sealed case 20 to define between it and the board 10 the cooling chamber 25 in which to cool the electronic devices 3 housed therein. That is, the sealed case 10 has the barriers 24 that extend alternately from the bottom panel 21 and one of the opposed side walls 22a and 22b toward the printed circuit board 10 and the other side wall and the latter toward the former. The lower marginal edge of each barrier 24 may be spaced apart from the printed circuit board 10.

Thus, there is formed between the printed circuit board 10 and each sealed case 20 the cooling chamber 25 in which the electronic devices 3 are housed and the coolant 7 meanders in such directions as indicated by the arrows. In this instance, the inlet and outlet ports 61 and 62 for one of the cooling chamber 25 may be dispensed with, but instead holes through which the both cooling chambers 25 communicate with each other are made in the printed circuit board 10 near the inlet and outlet ports 61 and 62 for the other cooling channel 25 so that the coolant 7 flows from one side to the other of the printed circuit board 10. This permits reduction of the number of inlet and outlet ports 61 and 62.

Next, a description will be given of the results of measurements indicating that the efficiency of cooling the electronic devices 3 can be increased by disturbing the coolant flux with the barriers 24 set up in the cooling chamber 25 as described above.

Figure 5:
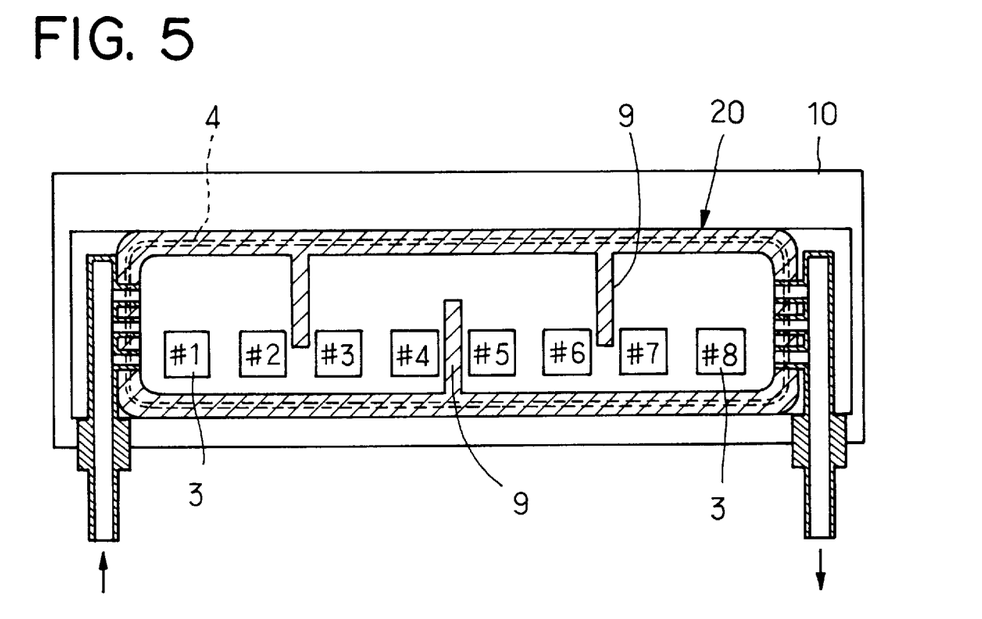
FIG. 5 is a plan sectional view of an electronic-devices-mounted, printed circuit board used for measurement of the effect of the present invention.

As shown in FIG. 5, the printed circuit board 10 used for the measurement has eight electronic devices 3 aligned in a row at equal intervals and the cooling chamber 25 has the barriers 24 extending between every second and third electronic devices 3. The sealed case 20 measures 200 by 40 mm$^2$. Each electronic device 3 is composed of a ceramic substrate measuring 16 by 16 by 1.0 mm$^3$ and an LSI formed thereon in a size of 7.5 by 7.5 by 0.5 mm$^3$ and has a heating value of 12 W.

Figure 6:
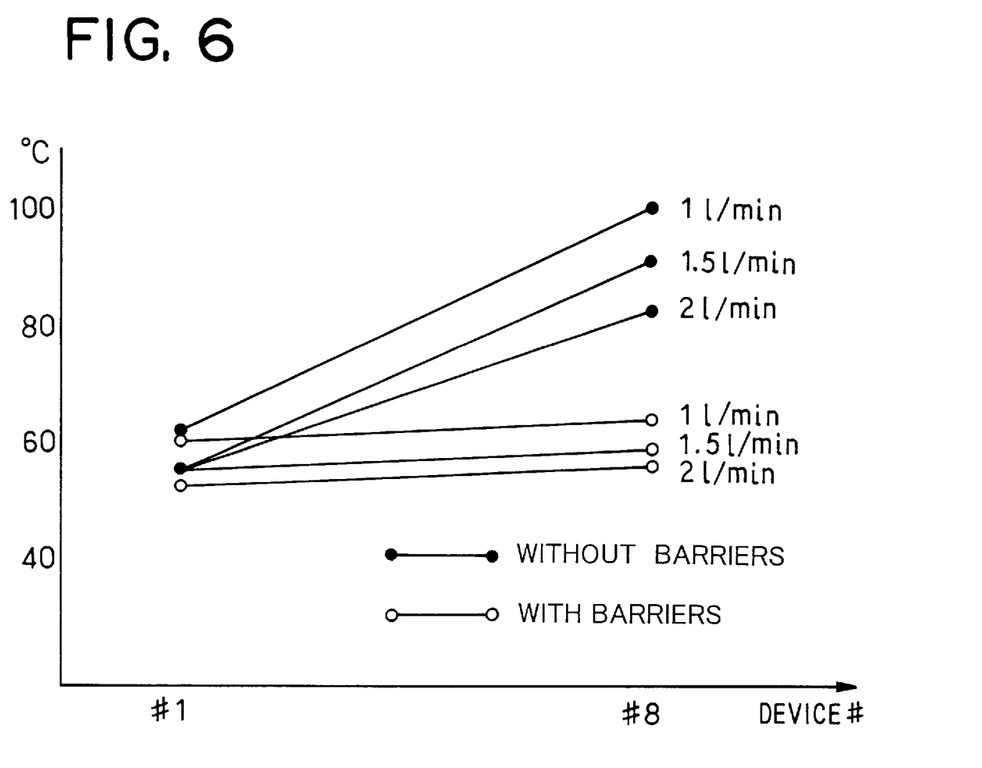
FIG. 6 is a graph showing measured values obtained with the printed circuit board of FIG. 5.

FIG. 6 shows measured values of the surface temperatures of electronic devices #1 and #8 in the cases where the flow rate of the coolant was set at 1000 cm$^3$/min, 1500 cm$^3$/min and 2000 cm$^3$/min, respectively. The coolant temperature at the inlet port 61 is 25° C. The black holes indicate the values measured with no barriers and the white holes the values measured with the barriers provided. FIG. 6 clearly demonstrates that the device cooling efficiency can be increased by the provision of the barriers 24.

Other embodiments of the cooler-equipped printed circuit board according to the present invention will be described below.

Figure 7A:
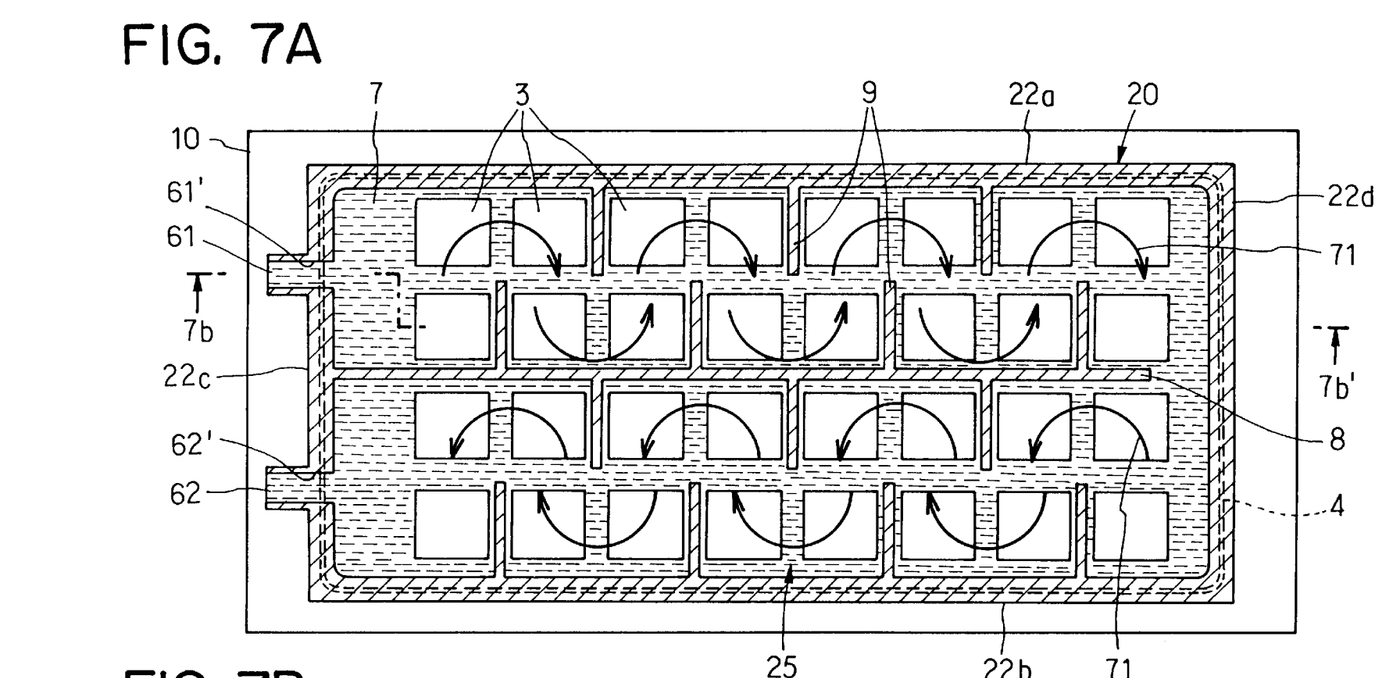
FIG. 7A is a plan sectional view of another embodiment of the present invention.
Figure 7B:
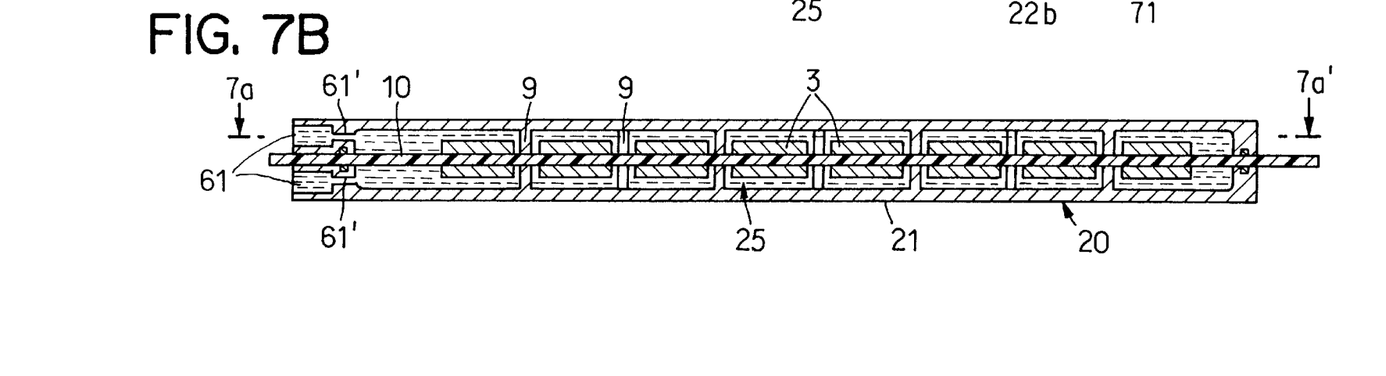
FIG. 7B is a sectional view taken on the line 7b–7b' in FIG. 7A.

In the embodiment of FIGS. 7A and 7B, there are mounted on either side of the printed circuit board 10 the electronic devices 3 in the form of a matrix with 8 rows and 4 columns. Reference numeral 8 denotes a partition wall, which divides the electronic device matrix into two submatrixes each consisting of two rows of electronic devices 3. In the end wall 22c divided by the partition wall 8 there are made the inlet and outlet ports 61 and 62 that communicate with the two regions of the cooling chamber 25, respectively. The partition wall 8 extends from the bottom panel 21 and the end wall 22c integrally therewith and when the upper sealed case 20 is mounted on the printed circuit board 10, the lower marginal edge of the partition wall 8 is pressed into liquidtight contact or engagement with the top of the printed circuit board 10, blocking the flow of the coolant 7 between the two separated regions of the cooling chamber 25. The end edge of the partition wall 8 lengthwise thereof does not extend to the end wall 22d to define therebetween a clearance, forming a substantially U-shaped coolant channel from the inlet port 61 to the outlet port 62 in the cooling chamber 25. In the U-shaped coolant channel, there are provided barriers 9 which extend alternately from the side walls 22a, 22b and the partition wall 8 into adjacent electronic devices 3. The barriers 9 are formed integrally with the bottom panel 21 and the side walls 22a, 22b or the partition wall 8 and have the same height as those of the side walls and the end walls and their lower marginal edges are urged against the printed circuit board 10 in a liquidtight manner when the upper sealed case 20 is mounted thereon. The width of each barrier 9 is about ½ the spacing between the side wall 222 or 22b and the partition wall 8. The barriers 9 are extended from the side walls 22a, 22b and the partition wall 8 alternately every other electronic device 3 in the direction of arrangement of the electronic devices 3. With such barriers 9, the coolant 7 flowing down the U-shaped channel from the inlet port 61 to the outlet port 62 repeatedly meander, so that the coolant flux is disturbed.

The cooling chamber 25 is filled with the coolant 7 flowing thereinto through the inlet ports 61 and 61' and the electronic devices 3 are immersed in the coolant 7. In this embodiment, since the cooling chamber 25 is separated into two compartments and since the barriers 9 are provided therein as mentioned above, the cross-sectional area of the coolant channel or passage is small. Hence, the velocity of flow of the coolant 7 is higher than in the embodiment of FIGS. 1A and 1B in the case of the same flow rate. The coolant 7 flowing into the cooling channel 25 becomes turbulent while striking against the barriers 9 at high velocity and flows as indicated by the arrows 71, cooling the electronic devices 3. Finally, the coolant 7 flows out of the cooling chamber 25 through the outlet ports 62 and 62'.

By the turbulent flow of the coolant 7, its higher and lower temperature portions are effectively mixed with each other to provide a uniform temperature distribution over the entire coolant flux, further heightening the electronic device cooling effect. While in this embodiment the electronic devices 3 are mounted on either side of the printed circuit board 10, they may be mounted only on one side of the board 10. Moreover, although this embodiment has only one partition wall 8 formed in the cooling chamber 25, it is also possible to adopt a construction wherein such partition walls are extended between adjacent electronic devices 3 in the row direction of their array alternately from the end walls 22c and 22d and the barriers 9 are extended between every second and third electronic devices 3 in the column direction alternately from the two opposed partition walls (or one partition wall 8 and the side wall 22a or 22b).

Figures 8, 8A:
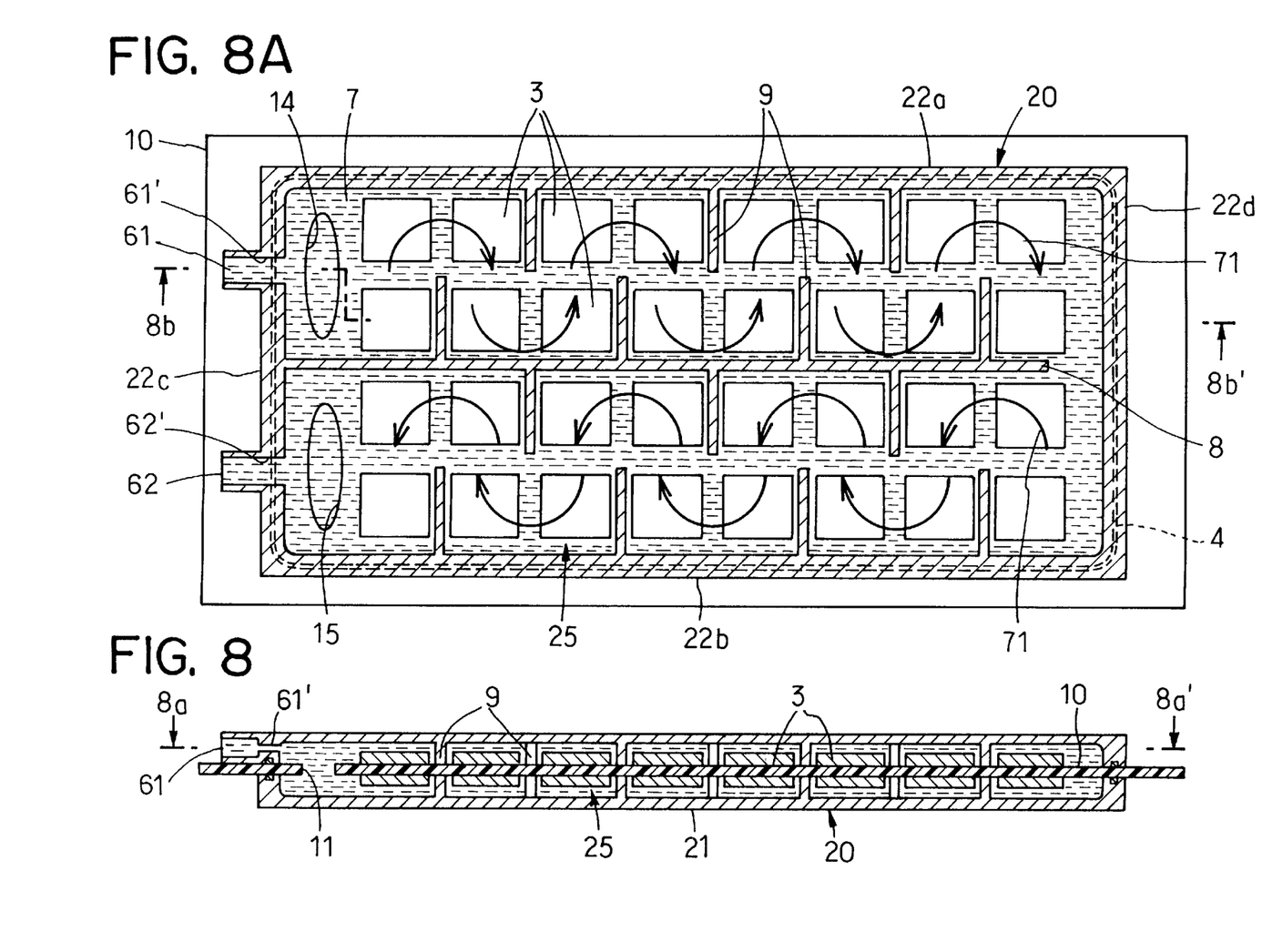
FIG. 8A is a plan sectional view of another embodiment of the present invention.

Turning next to FIGS. 8A and 8B, another embodiment of the present invention will be described. FIG. 8A is a sectional view taken on the line 8a–8a' in FIG. 8B and FIG. 8B a sectional view taken on the line 8b–8b' in FIG. 8A.

In this embodiment, there are mounted on both sides of the printed circuit board 10 the electronic devices 3 in the same fashion as in the embodiment of FIGS. 7A and 7B. The end wall 22c has only one inlet port 61' bored therethrough for injecting the coolant 7 into the cooling chamber 25 on the top of the printed circuit board 10 and in the vicinity of the inlet port 61' the printed circuit board 10 has an inlet port 14 through which the coolant 7 injected into the upper cooling chamber 25 is also distributed into that defined on the underside of the printed circuit board 10. Similarly, only one outlet port 62' is bored through the end wall 22c for discharging the coolant 7 to the outside. In the vicinity of the outlet port 62' the printed circuit board 10 an outlet port 15 bored therethrough, so that the coolant 7 from the lower cooling chamber 25 flows through the outlet port 15 and joins the coolant 7 having flowed through the upper cooling chamber, thereafter being discharged through the outlet port 62'.

In this embodiment, the coolant 7 injected through the inlet ports 61 and 61' flows into the cooling chamber 25 formed on the top of the printed circuit board 10 and also into the cooling chamber 25 defined on the underside of the printed circuit board 10 through the inlet port 14. The coolant 7 flowing into the upper cooling chamber 25 flows as indicated by the arrows 71 and flows out of the sealed case 20 through the outlets 62 and 62'. The coolant 7 flowing into the lower cooling chamber 25 through the inlet port 14 similarly flows through the cooling chamber 25, then flows into the upper cooling chamber 25 through the outlet port 15 and flows out of the sealed case 20 through the outlet ports 61' and 62.

According to this embodiment, by forming the inlet and outlet ports 14 and 15 in the printed circuit board 10 near the inlet and outlet ports 61' and 62', respectively, the coolant 7 can be distributed equally through the cooling chambers 25 on both sides of the printed circuit board 10 although one inlet port 61 and one outlet port 62 are provided for the two sealed cases 20. In addition, the provision of such ports does not introduce any particular complexity in the liquid cooling arrangement. That is, according to this embodiment, the number of tubes that must be connected to the inlet and outlet ports 61 and 62 is only two in all for each printed circuit board 10, hence the required number of tubes can be markedly decreased in the case of testing the electronic devices 3 on a plurality of such printed circuit boards 10 that are stacked in semiconductor test equipment. This is effective in downsizing the semiconductor test equipment.

Figure 9A:
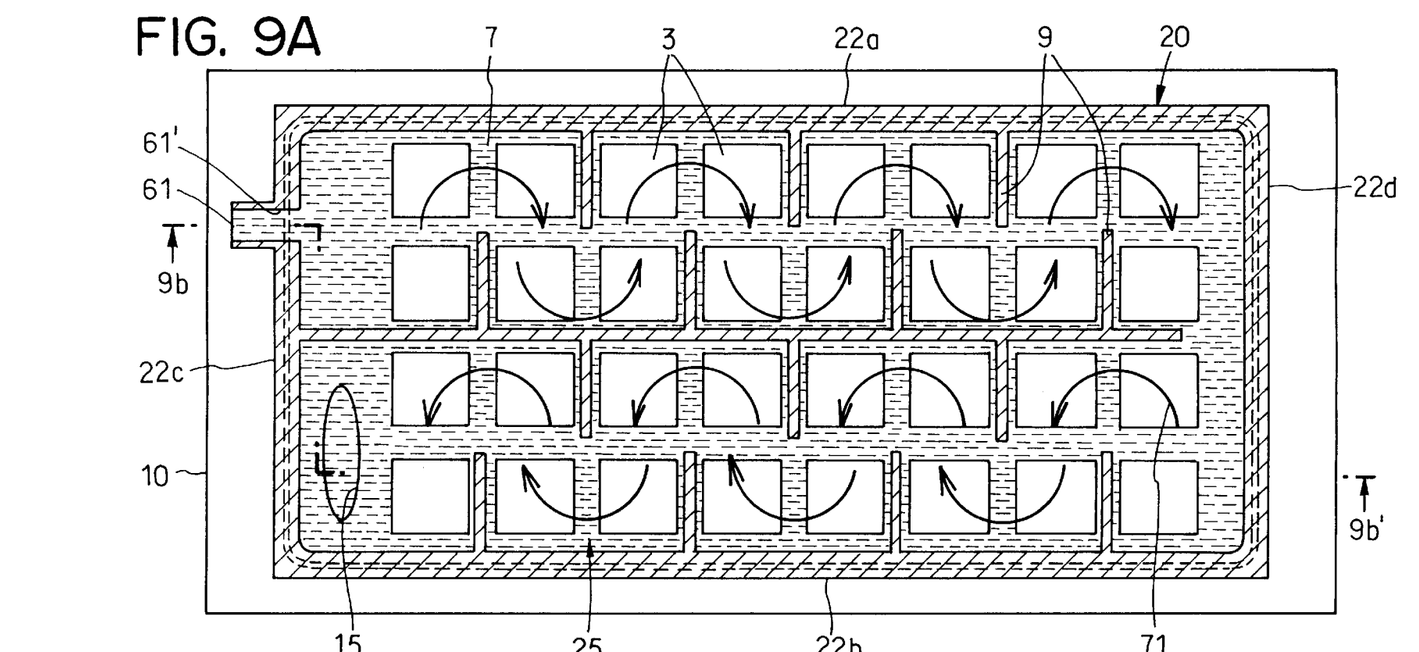
FIG. 9A is a plan sectional view illustrating a modified form of the embodiment shown in FIGS. 8A and 8B.
Figure 9B:
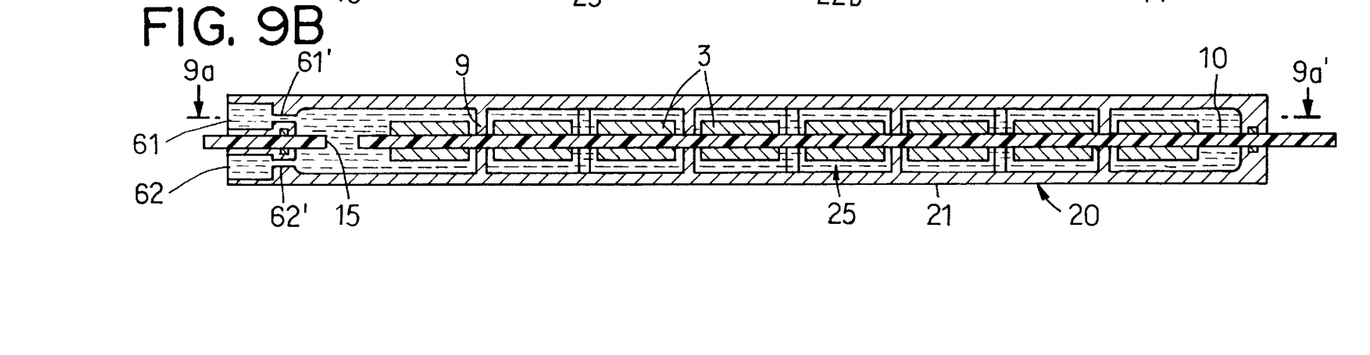
FIG. 9B is a sectional view taken on the line 9b–9b' in FIG. 9A.

FIGS. 9A and 9B illustrate a modified form of the embodiment shown in FIGS. 8A and 8B. In this embodiment, the inlet port 14 is omitted and the outlet ports 62' and 62 are made in the end wall 22c of the lower sealed case at positions corresponding to the inlet ports 61' and 61 of the upper sealed case so as to provide only one coolant channel through all the electronic devices 3 in the both upper and lower cooling chambers 25. With such a structure, in the case of cooling the electronic devices 3 by the coolant at the same flow rate as in the FIG. 8 embodiment, the flow velocity is doubled, producing increased cooling efficiency. In the FIG. 8 embodiment the ports 14 and 15, through which the upper and lower cooling chambers 25 communicate with each other, serve as coolant inlet and outlet ports for the lower cooling chamber 25. In the FIG. 9 embodiment the port 15 through which the upper and lower cooling chambers 25 communicate with each other serves both as a coolant outlet port for the upper cooling chamber 25 and as a coolant inlet port for the lower cooling chamber 25.

Figure 10:
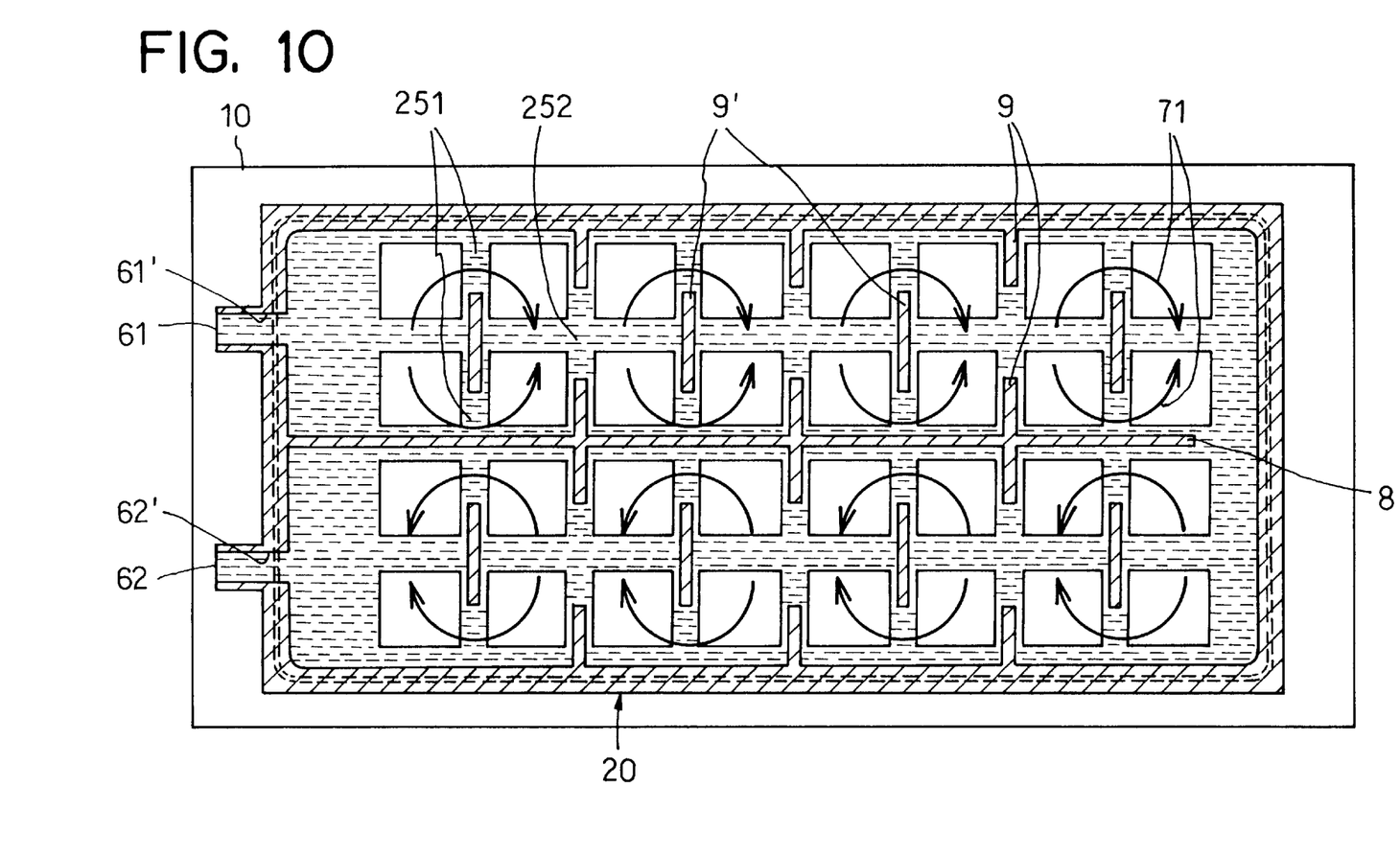
FIG. 10 is a plan sectional view of another embodiment of the present invention.

Turning next to FIG. 10, another embodiment of the present invention will be described, which is identical in construction with the FIG. 7 embodiment except the position of placement of each barrier 9. That is, in each compartment of the cooling chamber 25 separated by the partition wall 8, there are provided barriers 9 that stand upright from the bottom panel 21 (not shown) and extend in opposite directions from the side wall 22a (or 22b) and the partition wall 8 alternately every two electronic devices 3 in the row direction of their matrix array. The opposed side surfaces of adjacent barriers 9 define therebetween a central coolant channel 252. Reference numeral 9' denotes independent barriers each planted on the bottom panel 21 for each quartet of neighboring electronic devices 3 and extended toward the side wall 22a (or 22b) and the partition wall 8 in the column direction across the cross-shaped clearance that separates the four electronic devices. Between the opposed end edges of the independent barriers 9' and the side wall 22a (or 22b) and the partition wall 8 there are defined by-pass channels 251. Thus, the barriers 9 and the independent barriers 9' are placed alternately in the row direction of the matrix array of the electronic devices 3. The independent barriers 9' are also nearly equal in height to the side walls and the end walls. As mentioned above, the independent barriers 9' and the side wall or partition wall define therebetween the by-pass channels 251 and adjacent barriers 9 extended from the side wall and the partition wall toward each other define therebetween the central channel.

The coolant 7 flowing into the cooling chamber 25 through the inlet ports 61 and 61' is first diverted by the independent barrier 9' closest to the inlet port 61' into by-pass channels 251 as indicated by the arrow 71 and the diverted streams of the coolant 7 join downstream of the first independent barrier 9' and are mixed with each other. The coolant 7 thus joined and mixed flows through the central channel 252, then it is split again by the next independent barrier 9' into two streams flowing into the by-pass channels as indicated by the arrow 71 and the two streams join and are mixed downstream of this independent barrier 9'. Thereafter, the coolant 7 cools the electronic devices 3 while repeatedly flowing through the by-pass and central channels and it ultimately flows out of the cooling chamber 25 through the outlet ports 62' and 62.

In this embodiment, the coolant 7 is blocked and split by each independent barrier 9' into two streams flowing through the by-pass channels 251 as indicated by the arrow 71 and the two streams strike against each other downstream of the independent barrier 9', and hence they are sufficiently mixed together. As the result of this, the temperature of the coolant 7 is made uniform throughout it and the coolant 7 does not form high and low temperature laminar flows. Hence, the cooling efficiency increases accordingly.

Figure 11:
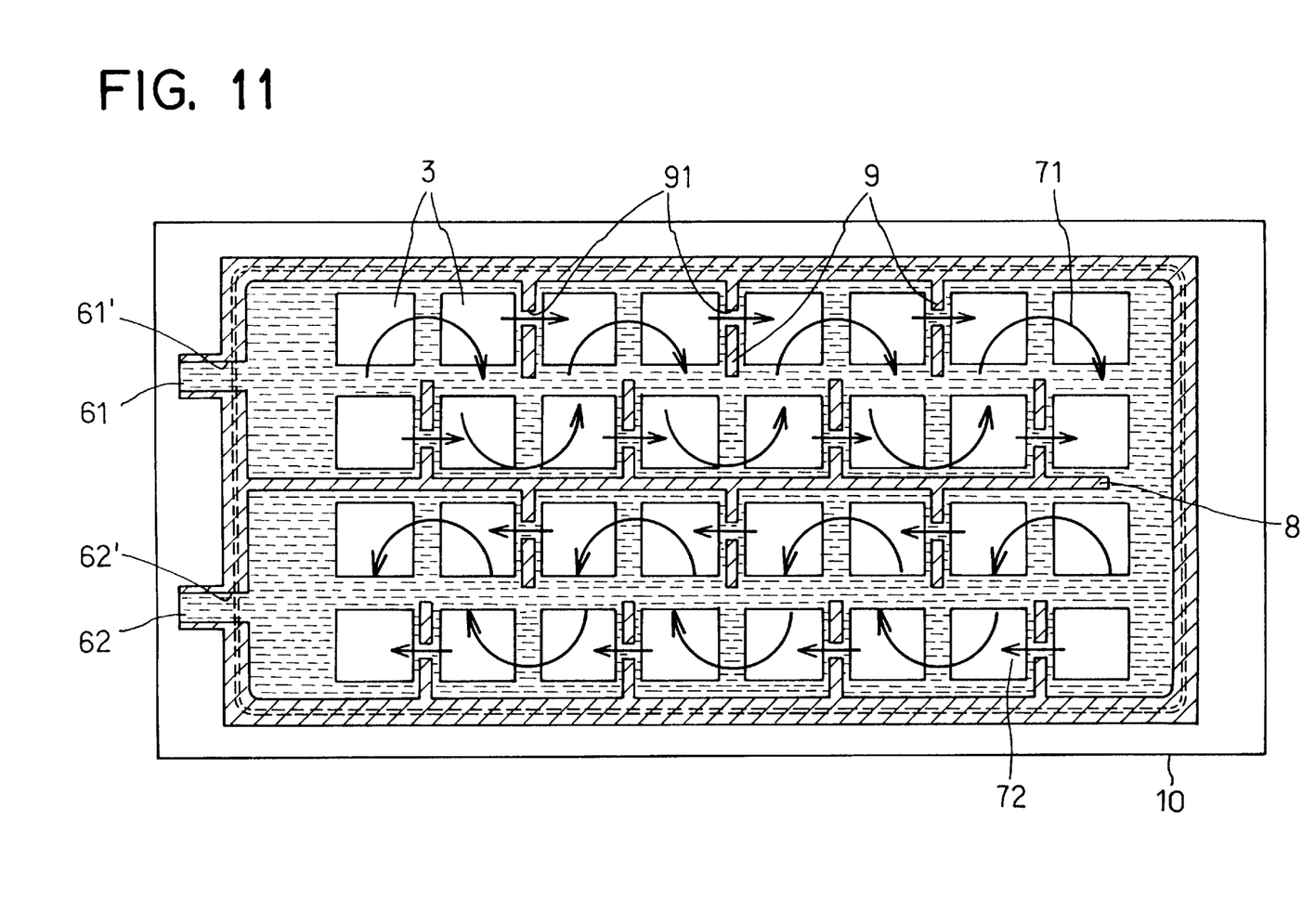
FIG. 11 is a plan sectional view of still another embodiment of the present invention.

Turning next to FIG. 11, another embodiment of the present invention will be described. In this embodiment, the barriers 9 in FIGS. 7, 8 or 9 each has one or more through holes drilled therethrough. As described above, the coolant 7 injected into the cooling chamber 25 through the inlet ports 61 and 61' is stirred by striking against the barriers 9 and cools the electronic devices 3 while meandering therethrough as indicated by the arrows 71. In this instance, however, the coolant 7 tends to stagnate near the back of each barrier 9, especially at the corner between the side wall 22a (22b) and the partition wall—this gives rise to a problem that the electronic device 3 just behind each barrier 9 is less cooled than the electronic device 3 just in front of the barrier 9.

As a solution to this problem, in the FIG. 11 embodiment one or more through holes 91 are bored through each barrier 9 and the coolant 7 which would otherwise stagnate in the vicinity of the barrier 9 flows directly to its back through the through holes 91, so that no stagnation of the coolant 7 does not occur. Also in the FIG. 10 embodiment, the through holes 91 may be formed through the independent barriers 9' to prevent stagnation of the coolant 7 near the center of the back of each barrier 9'. By forming such through holes through the barriers in the other embodiments, too, the same effect as mentioned above can be produced.

Figure 12:
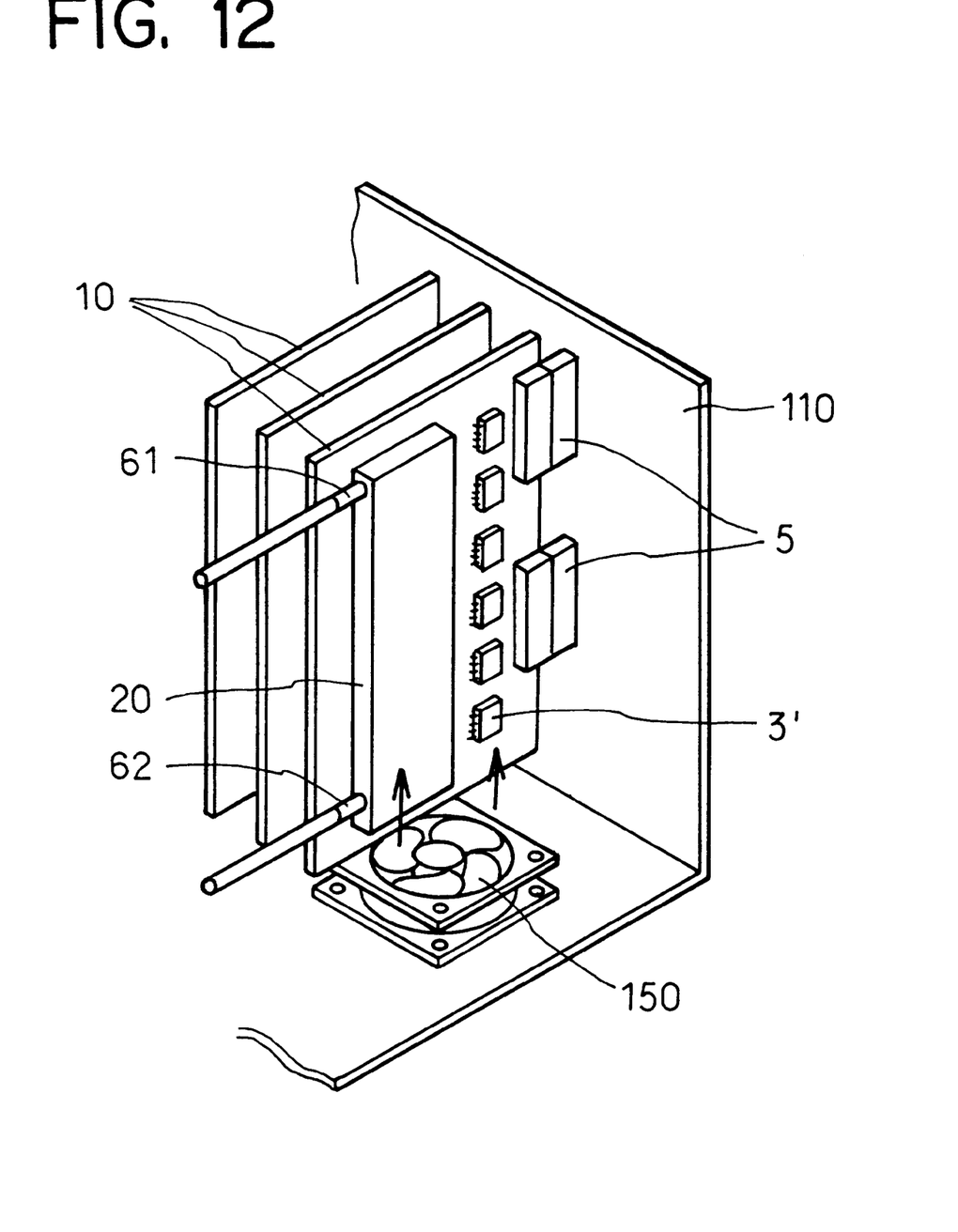
FIG. 12 is a perspective view of an embodiment in which electronic devices of relatively small calorific power are mounted on the same printed circuit board outside the sealed case and cooled by a forced air-cooling fan motor of test equipment.

In each of the embodiments described above, when it is necessary to mount electronic devices of relatively small calorific power on the same printed circuit board 10 together with electronic devices of large calorific power, the former may be mounted on the printed circuit board 10 outside the sealed case 20 as indicated by reference numeral 3' in FIG. 12 and cooled by a forced cooling fan 150 as shown. In FIG. 12 a plurality of electronic-devices-mounted, printed circuit boards 10 are mounted in parallel on a board mounting frame 110 of semiconductor test equipment and the cooling fan motor 150 is fixedly mounted on the board mounting frame 110 below the printed circuit boards 10. The cooling fan motor 150 blows air in parallel to the printed circuit boards 10 to cool the electronic devices 3' mounted thereon. When the electronic devices 3 of large calorific power and the electronic devices 3' of relatively small calorific power are mounted on the same printed circuit board 10, the packing density of the former on the printed circuit board 10 could be increased up to a value about the same as the packing density of the latter, by forced cooling of the electronic devices 3 by the coolant 7 in the cooling chamber 24 as described above.

Finally, a description will be given, with reference to FIGS. 13A, 13B and 13C, of structures for mounting the cooler-equipped printed circuit board on semiconductor test equipment.

Figure 13A:
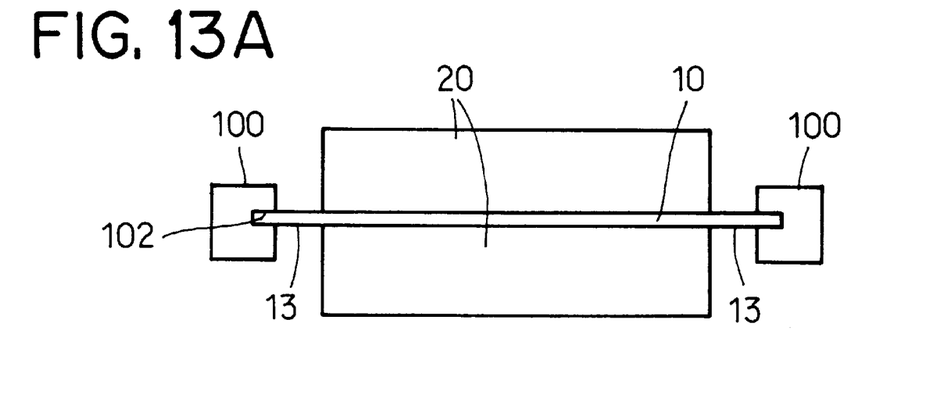
FIG. 13A is a side view showing an example of an electronic-devices-mounted, printed circuit board mounting structure.

In FIG. 13A, reference numeral 100 denotes guides that form part of the semiconductor test equipment (not shown). The guides 100 each have a guide groove 102 cut therein and guide the cooler-equipped printed circuit board 10 with its two opposed marginal edges slidably received in the grooves 102. The printed circuit board 10 with its marginal edges 13 fitted in the guide grooves 102 is guided by the guides 100 into the test equipment and fixed thereto.

Figure 13B:
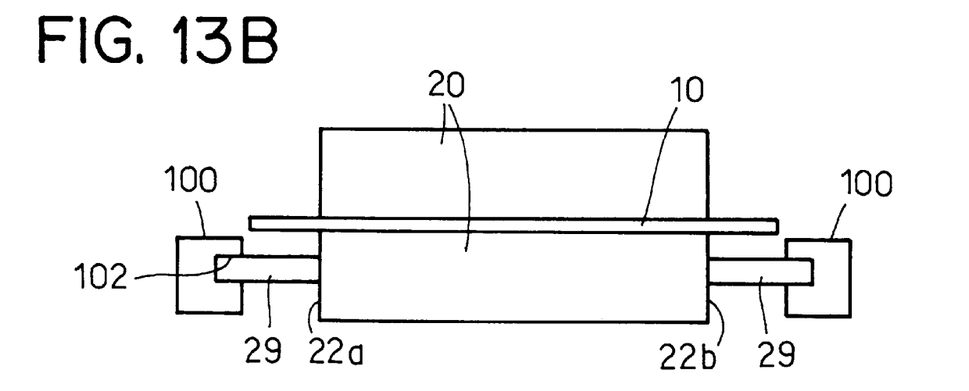
FIG. 13B is a side view showing another example of an electronic-devices-mounted, printed circuit board mounting structure.

In FIG. 13B, the opposed side walls 22a and 22b of the sealed case 20 of the cooler have projections 29 that are slidably received in the guide grooves 102 of the guides 100. The printed circuit board 100 with the projections 29 fitted in the guide grooves 102 is guided by the guides 100 into the test equipment.

Figure 13C:
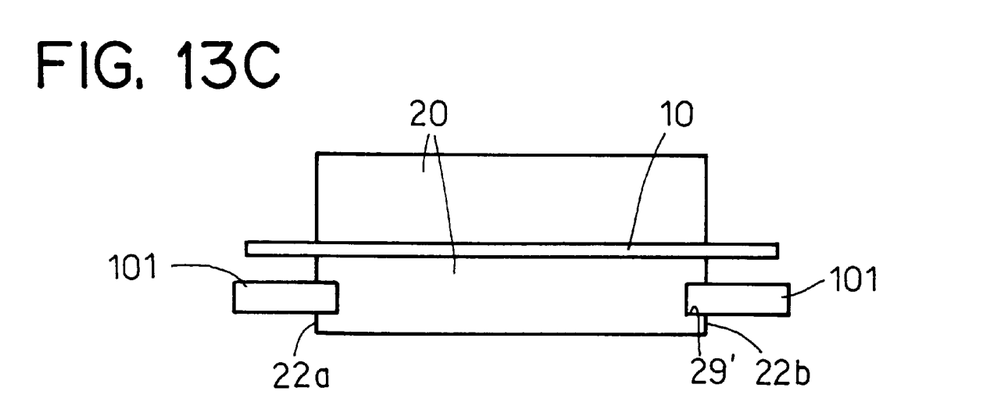
FIG. 13C is a side view showing still another example of an electronic-devices-mounted, printed circuit board mounting structure.

In FIG. 13C, reference numeral 101 denotes guide rails or projections forming part of the semiconductor test equipment. The opposed side walls 22a and 22b of the sealed case 20 each have a groove 29' for receiving one of the guide projections 101. The printed circuit board 10 with the guide projections 101 slidably received in its grooves 29' is guided along the guide projections 101 into the test equipment.

Thus, the cooler-equipped printed circuit board can be singly mounted on and dismounted from the semiconductor test equipment. While in the above embodiments the partition wall 8, the barriers 9 and the independent barriers 9' have been described to be extended from the sealed case 20, they may be planted on the printed circuit board 10. Further, the electronic devices 3 are not limited specifically to LSIs but may be any kinds of heat-generating electronic devices.

EFFECT OF THE INVENTION

As described above, according to the present invention, the sealed case 20 is mounted on the printed circuit board 10 in a manner to cover the electronic devices mounted thereon and the coolant 7 is injected into the sealed case 20 wherein it flows through the electronic devices 3 for forced absorption of heat generated by them, so that the electronic devices 3 can be cooled more efficiently than in the case of forced air cooling or cooling by natural convection of a coolant. With the provision of the barriers 9 (9') in the sealed case 20, the coolant 7 is effectively stirred and has a uniform temperature distribution, achieving a particularly high cooling efficiency. By forced circulation of the coolant 7 through the cooling chamber 25 at high pressure, the cooling effect can be further heightened.

With the provision of the inlet and outlet ports 14 and 15 bored through the printed circuit board 10 near the inlet and outlet ports 61' and 62', respectively, the coolant 7 can be distributed equally through the cooling chambers 25 on both sides of the printed circuit board 10 although one inlet port 61 and one outlet port 62 are provided for the two sealed cases 20. In addition, the provision of such ports does not introduce any particular complexity in the liquid cooling arrangement. That is, the number of tubes that must be connected to the inlet and outlet ports 61 and 62 is only two in all for each printed circuit board 10, hence the required number of tubes can be markedly decreased in the case of testing the electronic devices 3 on a plurality of such printed circuit boards 10 that are stacked in semiconductor test equipment. This is effective in downsizing the semiconductor test equipment.

Furthermore, the coolant 7 is blocked and split by each independent barrier 9' into two streams flowing through the by-pass channels 251 as indicated by the arrow 71 and the two streams strike against each other downstream of the independent barrier 9', and hence the coolant 7 is sufficiently stirred. As the result of this, the temperature of the coolant 7 is made uniform throughout it and the coolant 7 does not form high and low temperature laminar flows. Hence, the cooling efficiency increases accordingly.

With the provision of one or more through holes 91 bored through each barrier 9, the coolant 7 which would otherwise stagnate in the vicinity of the barrier 9 flows directly to its back through the through holes 91, so that no stagnation of the coolant 7 does not occur. By forming such through holes 91 through the independent barriers 9', it is possible to prevent the coolant 7 from stagnation near the center of the back of each barrier 9'.

By fitting the elastic 0 ring packing 4 into the groove 28 cut in the marginal edge 26 of each sealed case 20 on the printed circuit board 10, excellent sealing means 27 can be obtained. In this case, the liquidtightness is increased by the metallic pattern 14 which is predeposited on the surface area of the printed circuit board 10 for engagement with the marginal edge 26. The metallic pattern 14 is formed by depositing a copper pattern on the surface of the printed circuit board 10 or plating the copper pattern with gold. The plating the metallic pattern 14 with gold ensures long-term liquidtightness of the sealing means 27.

By adopting an arrangement for guiding the printed circuit board into semiconductor test equipment by the guides 100 or guide projections 101 that form part of the test equipment, the printed circuit board 10 can be singly mounted on or dismounted from the test equipment.

It will be apparent that many modifications and variations may be effected without departing from the scope of the novel concepts of the present invention.

What is claimed is:

1. An electronic-devices-mounted, printed circuit board comprising:

a printed circuit board including an array of electronic devices mounted on at least one side thereof;

a sealed case covering said array of electronic devices, having its marginal edge held in liquidtight contact with said one side of said printed circuit board all around said array of electronic devices and including an inlet port injecting a coolant into an interior of said sealed case from the outside and an outlet port discharging said coolant from said sealed case to the outside, wherein the interior of said sealed case forms a cooling chamber in which said electronic devices are immersed in said coolant injected through said inlet port and said coolant is distributed through said electronic devices and discharged to the outside through said outlet port;

another array of electronic devices mounted on another side of said printed circuit board;

a second sealed case mounted on a surface of said another side of said printed circuit board in a liquidtight manner for sealing therein said electronic devices;

a port bored through said printed circuit board near said inlet port to inject therethrough said coolant into said second sealed case; and another port bored through said printed circuit board near said outlet port to discharge therethrough said coolant from said second sealed case.

2. The electronic-devices-mounted, printed circuit board of claim 1, wherein said cooling chamber has a plurality of barriers each extending into one of spaces between said electronic devices in the direction across their arrays so that a coolant channel from said inlet port to said outlet port meanders.

3. The electronic-devices-mounted, printed circuit board of claim 2, wherein: said sealed case has a box-like configuration comprising a bottom panel and a pair of opposed side walls extending in the direction of said electronic device array; said electronic devices are spaced apart; and said barriers are extended between said electronic devices across their array alternately from one and the other of said opposed side walls to define clearances by extended ends of said barriers and said side walls opposite them, respectively, thereby making said coolant channel from said inlet port to said outlet port meander.

4. The electronic-devices-mounted, printed circuit board of claim 3, wherein said electronic device array is a 3 by 2 matrix array.

5. The electronic-devices-mounted, printed circuit board of claim 3, wherein said barriers are each extended from said bottom panel to said printed circuit board.

6. The electronic-devices-mounted, printed circuit board of claim 2, wherein said electronic device array is a matrix array and said barriers are staggered so that they do not overlap in columns of said matrix array.

7. The electronic-devices-mounted, printed circuit board of claim 6, wherein said matrix array of electronic devices is a matrix with at least 3 rows and at least 2 columns and said barriers are disposed so that the barriers in two arbitrary adjacent spaces between the electronic devices in the row direction are alternately extended across the spaces between said electronic devices in the column direction.

8. An electronic-devices-mounted, printed circuit board comprising:

a printed circuit board including a matrix array of electronic devices mounted on at least one side thereof, said matrix array comprising an array of four columns of electronic devices and at least three rows of electronic devices; and a sealed case covering said array of electronic devices, having its marginal edge held in liquidtight contact with said one side of said printed circuit board all around said array of electronic devices, and including an inlet port injecting a coolant into an interior of said sealed case from outside and an outlet port discharging said coolant from said sealed case to the outside, said interior of said sealed case forming a cooling chamber in which said electronic devices are immersed in said coolant injected through said inlet port, wherein coolant is distributed through said electronic devices and discharged to the outside through said outlet port, said sealed case forming a box-like configuration comprising:

a bottom panel, a pair of opposed side walls extending toward said electronic device array, and a pair of opposed end walls joining opposite ends of said side walls, respectively;

said sealed case further comprising a partition wall extending from one of said end walls toward the other of said end walls to form a clearance between the partition wall and said other of said end walls and dividing said matrix array of electronic devices into two sub-matrix arrays by column, thereby providing a substantially U-shaped coolant channel from said inlet port to said outlet port in said cooling chamber, wherein:

each of said two sub-matrix arrays is an array of two columns of electronic devices;

barriers are extended from said partition wall and each of said side walls and alternately project into spaces between the rows defined by said electronic devices of said two columns of each of said two sub-matrix arrays; and one of the ends of each of said barriers are spaced apart from said partition wall and said one side wall to make said U-shaped coolant channel meander.

9. The electronic-devices-mounted printed circuit board of claim 8, wherein: said partition wall is extended from said bottom panel and one of said end walls and has the same height as said side walls and said end walls; said barriers are extended from at least one of said bottom panel, said side walls and said partition wall and have the same height as said side walls and said partition wall; and the extended ends of said barriers in the row direction and said side wall and said partition wall in the direction of extension of said barriers define therebetween clearances which permit the passage therethrough of said coolant.

10. The electronic-devices-mounted, printed circuit board of claim 8, wherein said barriers are formed integrally with said bottom panel.

11. The electronic-devices-mounted, printed circuit board of claim 8, wherein said barriers are fixed to said printed circuit board.

12. The electronic-devices-mounted, printed circuit board of claim 8, wherein said barriers each have a through hole.

13. The electronic-devices-mounted, printed circuit board of claim 8, further comprising sealing means comprising a groove cut in a marginal edge of said sealed case all around it and an elastic O ring packing fitted in said groove and pressed against said printed circuit board.

14. The electronic-devices-mounted, printed circuit board of claim 13, wherein a metallic pattern is predeposited over the surface area of said printed circuit board against which said elastic O ring packing fitted in said groove cut in said marginal edge of said sealed case is pressed to provide liquidtight sealing.

15. The electronic-devices-mounted, printed circuit board of claim 14, wherein said metallic pattern is a copper pattern.

16. The electronic-devices-mounted, printed circuit board of claim 14, wherein said metallic pattern is plated with gold.

17. The electronic-devices-mounted, printed circuit board of claim 8, further comprising another array of electronic devices mounted on another side of said printed circuit board, and a second sealed case mounted on a surface of said another side of said printed circuit board in a liquidtight manner for sealing therein said electronic devices.

18. The electronic-devices-mounted, printed circuit board of claim 8, further comprising a second electronic device disposed on said printed circuit board but outside said sealed case so that it is subjected to forced cooling.

19. The electronic-devices-mounted, printed circuit board of claim 8, wherein projections protrusively provided on two opposed marginal edges of said printed circuit board for engagement with guide grooves of guide means of semiconductor test equipment.

20. The electronic-devices-mounted, printed circuit board of claim 8, wherein projections protrusively provided on two opposed side walls of said sealed case for engagement with guide grooves of guide means of semiconductor test equipment.

21. The electronic-devices-mounted, printed circuit board of claim 8, wherein grooves are cut in two opposed side walls of said sealed case for engagement with guide projections of semiconductor test equipment.

22. An electronic-devices-mounted, printed circuit board comprising:

a printed circuit board including an array of electronic devices mounted on at least one side thereof;

a sealed case covering said array of electronic devices, having its marginal edge held in liquidtight contact with said one side of said printed circuit board all around said array of electronic devices, and including an inlet port injecting a coolant into an interior of said sealed case from outside and an outlet port discharging said coolant from said sealed case to the outside, said interior of said sealed case forming a cooling chamber in which said electronic devices are immersed in said coolant injected through said inlet port, wherein coolant is distributed through said electronic devices and discharged to the outside through said outlet port, said sealed case forming a box-like configuration comprising:
  a bottom panel,
  a pair of opposed side walls extending toward said electronic device array, and
  a pair of opposed end walls joining opposite ends of said side walls, respectively;

said sealed case further comprising a partition wall extending from one of said end walls toward the other of said end walls to form a clearance between the partition wall and said other of said end walls and dividing said array of electronic devices into two sub-matrix arrays by column, thereby providing a substantially U-shaped coolant channel from said inlet port to said outlet port in said cooling chamber;

independent barriers each inserted in one of alternate spaces between rows of said electronic devices of each submatrix array and extended into a space between columns of each submatrix array and between said electronic devices, both ends of each of said independent barriers being opposed to and spaced apart from each of said side walls and said partition wall to define therebetween coolant by-pass channels; and two barriers alternately extended from said each side wall and said partition wall toward each other and projecting into spaces adjacent to said alternate ones between rows of said electronic devices, extended ends of said two barriers being opposed to and spaced apart from each other to define therebetween a central channel.

23. The electronic-devices-mounted, printed circuit board of claim 22, wherein said barriers and said independent barriers are fixed to said printed circuit board.

24. The electronic-devices-mounted, printed circuit board of claim 22, wherein said barriers and said independent barriers each have a through hole.

25. The electronic-devices-mounted, printed circuit board of claim 22, further comprising sealing means comprising a groove cut in a marginal edge of said sealed case all around it and an elastic O ring packing fitted in said groove and pressed against said printed circuit board.

26. The electronic-devices-mounted, printed circuit board of claim 22, further comprising another array of electronic devices mounted on another side of said printed circuit board, and a second sealed case mounted on a surface of said another side of said printed circuit board in a liquidtight manner for sealing therein said electronic devices.

27. The electronic-devices-mounted, printed circuit board of claim 22, further comprising a second electronic device disposed on said printed circuit board but outside said sealed case so that it is subjected to forced cooling.

28. The electronic-devices-mounted, printed circuit board of claim 22, wherein projections protrusively provided on two opposed marginal edges of said printed circuit board for engagement with guide grooves of guide means of semiconductor test equipment.

29. The electronic-devices-mounted, printed circuit board of claim 22, wherein projections protrusively provided on two opposed side walls of said sealed case for engagement with guide grooves of guide means of semiconductor test equipment.

30. The electronic-devices-mounted, printed circuit board of claim 22, wherein grooves are cut in two opposed side walls of said sealed case for engagement with guide projections of semiconductor test equipment.

31. The electronic-devices-mounted, printed circuit board of claim 22, wherein said partition wall, said barriers and said independent barriers are formed integrally with said bottom panel to about a same height as said side walls and said end walls.

* * * * *